United States Patent [19]

Minato

[11] Patent Number: 5,016,075
[45] Date of Patent: May 14, 1991

[54] SEMICONDUCTOR MEMORY DEVICE

[75] Inventor: Yukio Minato, Tokyo, Japan

[73] Assignee: NEC Corporation, Japan

[21] Appl. No.: 421,816

[22] Filed: Oct. 16, 1989

[30] Foreign Application Priority Data

Oct. 14, 1988 [JP] Japan .................... 63-258481

[51] Int. Cl.[5] ............... H01L 29/72; H01L 27/14; H01L 31/00; H01L 31/14
[52] U.S. Cl. ......................... 357/35; 357/31; 357/32; 357/34; 365/34
[58] Field of Search ........... 357/34, 35; 437/32, 437/31; 365/154; 351/34

[56] References Cited

U.S. PATENT DOCUMENTS

| 4,056,810 | 11/1977 | Hart et al. | 357/35 |
| 4,152,627 | 5/1979 | Priel et al. | 357/35 |
| 4,257,059 | 3/1981 | Herndon | 357/35 |
| 4,320,410 | 3/1982 | Nishizawa | 357/35 |
| 4,580,244 | 4/1986 | Birrittella | 365/154 |
| 4,589,096 | 5/1986 | Kaneko et al. | 365/154 |
| 4,667,218 | 5/1987 | Takahashi | 357/34 |
| 4,826,780 | 5/1989 | Takemoto et al. | 357/34 |
| 4,914,629 | 4/1990 | Blake et al. | 365/154 |

FOREIGN PATENT DOCUMENTS 58-157169  9/1983  Japan .................... 357/41

OTHER PUBLICATIONS

Bhattacharyya et al., "Dual Base Lateral Bipolar Transistor", Sept. 1977 of IBM, 357 *35.

Primary Examiner—Andrew J. James
Assistant Examiner—Daniel Y. J. Kim
Attorney, Agent, or Firm—Ostrolenk, Faber, Gerb & Soffen

[57] ABSTRACT

A semiconductor memory device is constructed of a lateral bipolar transistor as a load element. The base region of the lateral bipolar transistor has an impurity concentration which is increased from the upper surface of the base region in the depth direction of the base region.

15 Claims, 6 Drawing Sheets

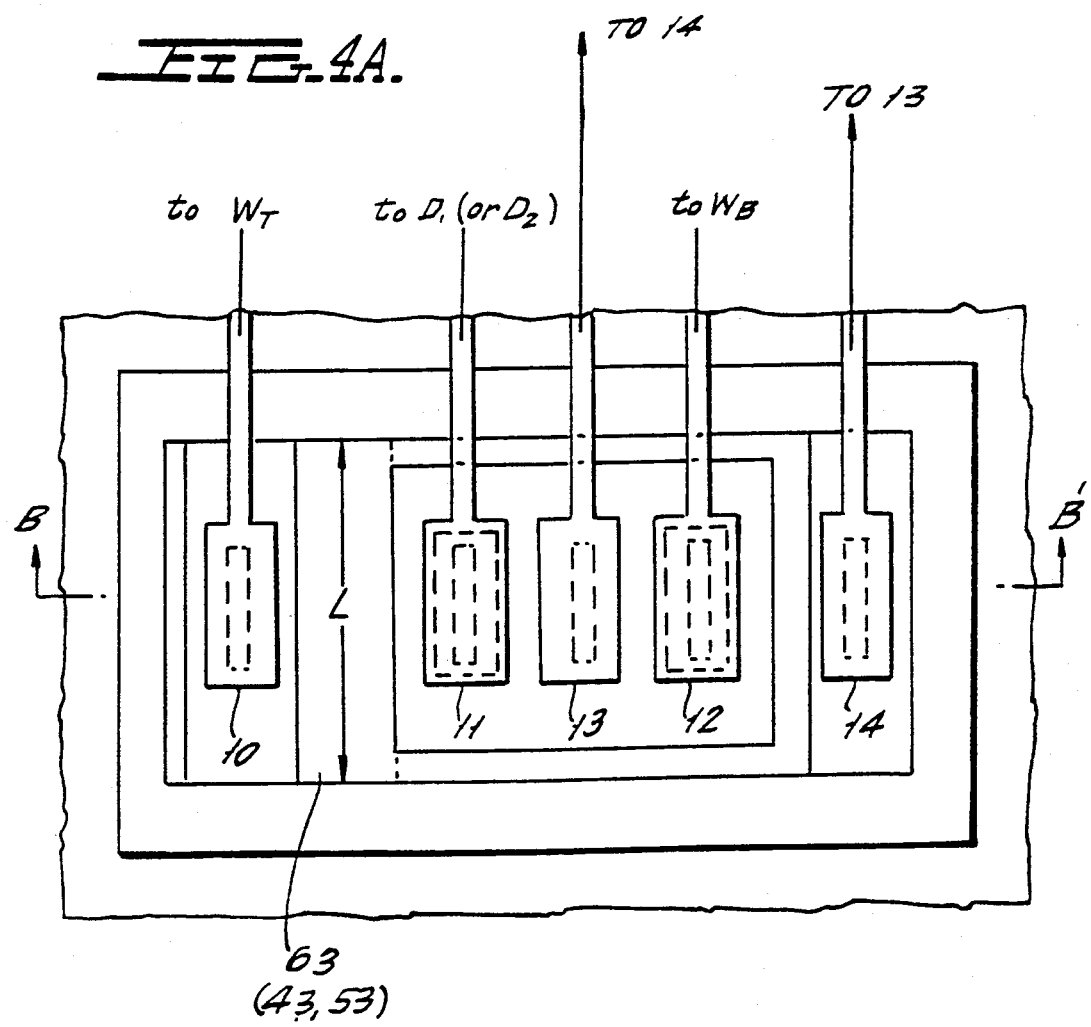
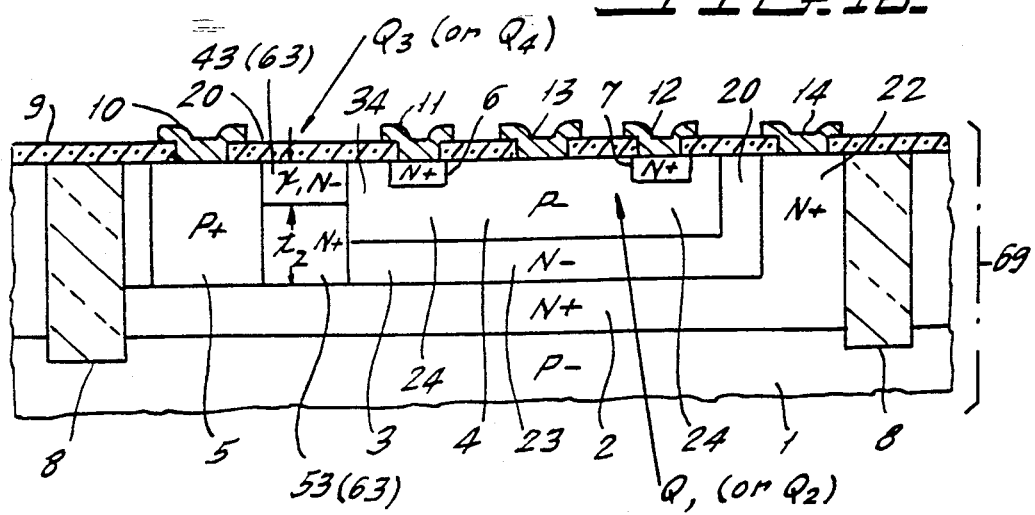

SEMICONDUCTOR MEMORY DEVICE

BACKGROUND OF THE INVENTION

1. Field of the Invention

The present invention relates to a semiconductor memory device, and more particularly, to a semiconductor memory device having a plurality of random access memory (RAM) cells each including a lateral bipolar transistor as a load element.

2. Description of Related Art

Bipolar RAM devices have been widely used, for example, in computers of large capacity as the cash memories thereof. Recently, the high integration density and fast switching speed of the bipolar RAM devices have been required for increasing performance of computers. The bipolar RAM devices are mainly employed as 16 to 64 Kilo bit (Kb) memory devices, and the devices of high integration density are favorable in which a PNP bipolar transistor is employed as the load element of the memory cell in view of electric power consumption, rather than using an SBD.

The memory cell using a conventional lateral PNP bipolar transistor as the load element has a fast reading speed. However, its writing speed is slow. A writing speed of a memory cell using a lateral bipolar transistor as the load element depends mainly on its cut-off frequency $f_T$ and its characteristic of current amplification factor $\beta$ when its emitter is grounded. Concerning the cut-off frequency, an operation of about one tenth to several nano seconds can be obtained by a base width of about several microns which is determined by photolithography process steps, although the base width of the lateral PNP transistor is inferior by about two figures to that of a vertical PNP transistor having a width of one tenth of a micron. Therefore, the cut-off frequency can sufficiently respond to a necessary writing speed of several nano seconds. On the other hand, concerning the current amplification factor $\beta$ when its emitter is grounded, the value $\beta$ must be large, for example, more than 7, at a small amount of current range in the holding operation of the memory cell for obtaining a strong immunity against $\alpha$ radiations or noises. In contrast, the value $\beta$ must be small, for example, less than 0.2 at a large amount of current range in the writing operation of the memory cell for obtaining a fast reversing speed. However, in a prior art, the current amplification factor $\beta$ of a PNP lateral transistor formed as the load element is gradually decreased from its small current range to its large current range with a gentle slope. Therefore, the value $\beta$ cannot be sufficiently small in the writing operation. Consequently, a conventional memory cell has a defect in that the writing speed is inevitably slow.

SUMMARY OF THE INVENTION

Accordingly, it is an object of the present invention to provide a semiconductor memory device having a lateral bipolar transistor as a load element, which has a fast writing speed by rendering the current amplification factor of the load transistor value sufficiently small value during the writing operation while maintaining it large during the holding operation.

According to one feature of the present invention, there is provided a semiconductor memory device which comprises a semiconductor substrate having a major surface and a plurality of memory cells formed on the substrate, each memory cell including a lateral bipolar transistor as a load element. The transistor has a collector region of a first conductivity type formed in the substrate from the major surface, an emitter region of the first conductivity type formed in the substrate from the major surface and a base region of a second conductivity type opposite to the first conductivity type formed in the substrate from the major surface between the collector and emitter regions, and the base region has an impurity concentration of the second conductivity type which is increased from the major surface in the depth direction of the base region. Generally, the first conductivity type is P-type and the second conductivity type is N-type so that the load transistor is a PNP type lateral bipolar transistor. The base region of the present invention may be constituted by a first portion having an upper surface coinciding with the major surface, sides abutted against the collector and emitter regions with PN junctions, respectively, and a bottom, and a second portion having an upper face adjacent to the bottom of the first portion and sides abutted against the collector and emitter region with PN junctions, respectively, the second portion of the base region having a higher impurity concentration of the second conductivity type than the first portion of the base region. Alternatively, it may be constituted by an upper portion having a first impurity concentration of the second conductivity type, coinciding at its upper face with the major surface of the substrate and adjacent at its sides to the collector and emitter regions with PN junctions, respectively, a middle portion having a second impurity concentration of the second conductivity type higher than the first impurity concentration, positioned underneath the upper portion and adjacent at its sides to the collector and emitter regions with PN junctions, respectively, and a lower portion having a third impurity concentration of the second conductivity type higher than the second impurity concentration, positioned underneath the middle portion and adjacent at its sides with PN junctions, respectively.

To avoid the formation of an unfavorable inversion layer at the major surface of the base region, the impurity concentration of the first portion or the upper portion of the base region is preferably $10^{14}$ cm$^{-3}$ or more. To obtain a sufficiently large value of the current amplification factor $\beta$ in the memory holding time and a sufficiently small value of current amplification factor $\beta$ in the memory writing time, the impurity concentration of the first portion or the upper and middle portions of the base region is preferably $10^{17}$ cm$^{-3}$ or less; the impurity concentration of the second portion or the lower portion of the base region is preferably $10^{18}$ cm$^{-3}$ or more; and the boundary between the first and second portions or between the middle and lower portions is preferably positioned at a depth from the major surface ranging from 0.1 $\mu$m to 0.6 $\mu$m.

According to an another aspect of the present invention, there is provided a semiconductor memory device comprising a plurality of memory cells each including a load transistor. The load transistor has a current amplification factor characteristic such that the current amplification factor is abruptly decreased at a collector current range between a small collector current range in the memory holding operation of the memory cell and a large collector current range in the memory writing operation of the memory cell.

A small amount of collector current (for example, 1 $\mu$A) is apt to flow through an upper portion of a base region near a major surface of a substrate because an emitter electrode is connected to the major (upper) surface of the emitter region of the lateral transistor, and a passage of a large amount of collector current (for example, 500 μA) spreads deeply in the base region. Therefore, according to the present invention, the small collector current in the holding operation predominately flows through the low impurity concentration, base portion so that a sufficiently large value current amplification factor $\beta$ can be obtained for a reliable holding operation, and in the writing operation, a large amount of current is flown through the high impurity concentration base portion, that is, a lower portion adding to the upper portion so that a sufficiently small value current amplification factor $\beta$ can be obtained for a fast writing operation.

BRIEF DESCRIPTION OF THE DRAWINGS

FIG. 4A is a plan view showing a first embodiment of the present invention, and FIG. 4B is a cross-sectional view taken along line B-B′ in FIG. 4A as viewed in the direction of arrows;

DETAILED DESCRIPTION OF EMBODIMENTS

Figure 1:
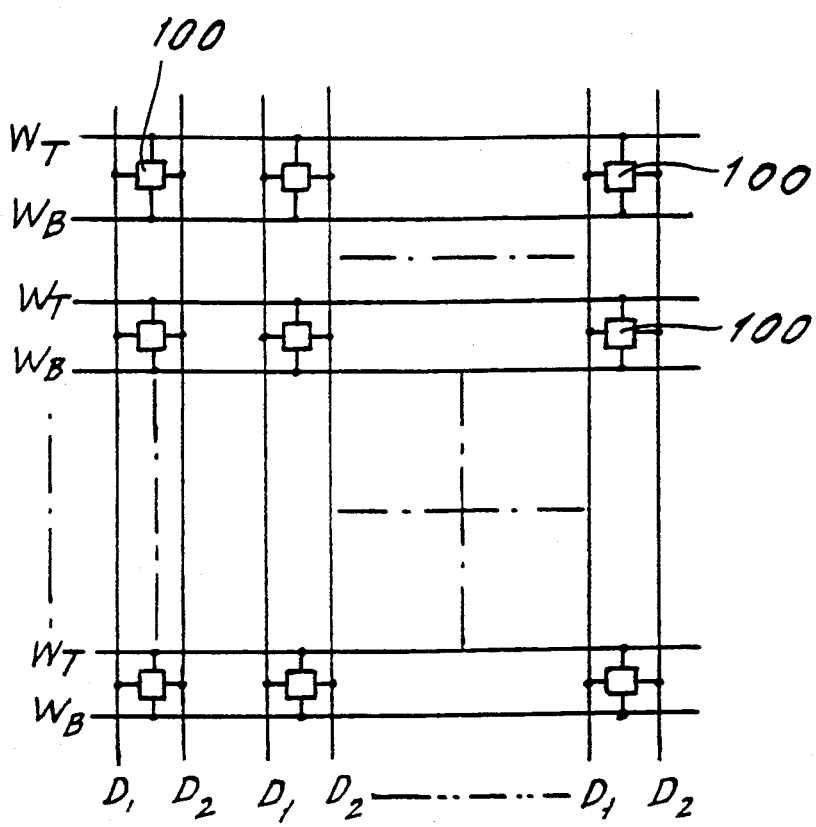
FIG. 1 is a circuit diagram schematically showing a memory cell array.
Figure 2:
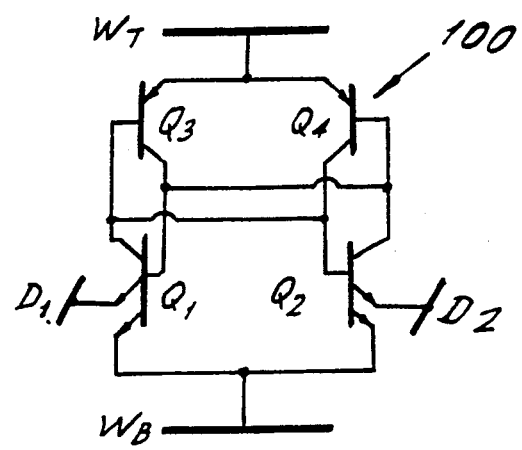
FIG. 2 is a circuit diagram showing a well-known bipolar memory cell.

As shown in FIG. 1, a plurality of memory cells 100 are formed on a semiconductor substrate, arranged in a matrix form and connected to corresponding pairs of first and second word lines $W_T$, $W_B$ and to corresponding pairs of first and second digit lines $D_1$, $D_2$, respectively. Referring to FIG. 2, each memory cell 100 includes first and second lateral PNP bipolar transistors $Q_3$, $Q_4$ as load transistors, and first and second NPN multi-emitter vertical bipolar transistors $Q_1$, $Q_2$ as read/write and hold transistors. The P-type emitters of the transistors $Q_3$, $Q_4$ are commonly connected to the first word line $W_T$, and the N-type first emitters of the transistors $Q_1$, $Q_2$ are commonly connected to the second word line $W_B$ (hold line). The N-type second emitter of the transistor $Q_1$ is connected to the first digit line $D_1$, and the N-type second emitter of the transistor $Q_2$ is connected to the second digit line $D_2$. The N-type base of the transistor $Q_3$ is connected to the N-type collector of the transistor $Q_1$, to the P-type collector of the transistor $Q_4$ and to the P-type base of the transistor $Q_2$, and the N-type base of the transistor $Q_4$ is connected to the N-type collector of the transistor $Q_2$, to the P-type collector of the transistor $Q_3$ and to the P-type base of the transistor $Q_1$, so as to constitute a flip-flop fashion.

The first PNP lateral transistor $Q_3$ as the load element and the first NPN multi-emitter vertical transistor $Q_1$ are formed in a common section of the substrate surrounded by an isolation region to constitute a first series connection, and also the second PNP lateral transistor $Q_4$ as the load element and the second NPN multi-emitter vertical transistor $Q_2$ are formed in a common section of the substrate surrounded by an isolation region to constitute a second series connection.

Figure 3:
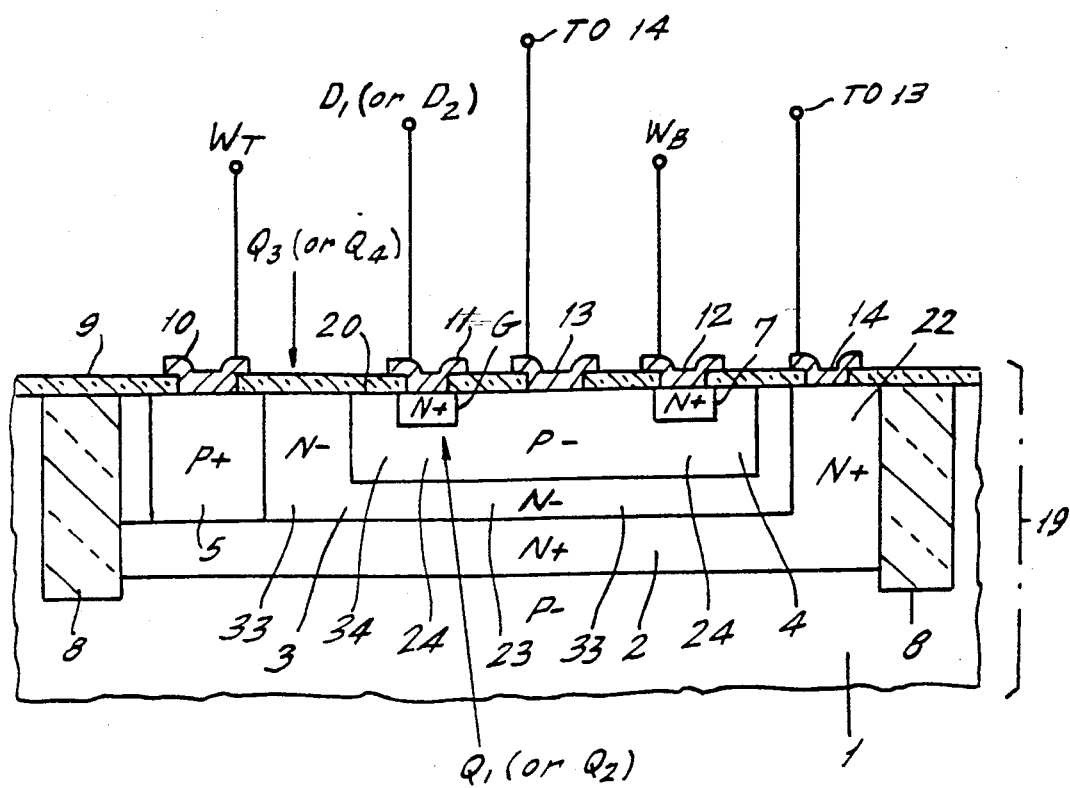
FIG. 3 is a cross-sectional view showing a part of the memory cell in FIG. 2 in which a lateral load transistor in a prior art is formed.

Referring to FIG. 3, one of the first and second series connections in a prior art will be explained.

An $N^-$-type silicon epitaxial layer 3 of $1 \times 10^{16}$ cm$^{-3}$ impurity concentration is formed on a $P^-$-type silicon body and an $N^+$-type buried layer 2 of $5 \times 10^{19}$ cm$^{-3}$ impurity concentration is formed between the silicon body 1 and the silicon epitaxial layer 3 so as to form a silicon substrate 19 by the body 1 and layers 3, 2. An isolation region 8, formed by a silicon oxide layer filling a trench, extends from a major surface 20 of the silicon epitaxial layer 3, that is, of the substrate 19, into the silicon body and surrounds an element forming section of the silicon epitaxial layer. An $N^+$-type lead-out region 22 of $5 \times 10^{19}$ cm$^{-3}$ impurity concentration is formed from the major surface 20 of the substrate to the $N^+$-type buried layer 2, and a $P^+$-type impurity region 5 of $1 \times 10^{17}$ cm$^{-3}$ impurity concentration is formed from the major surface 20 inwardly. A $P^-$-type impurity region 4 of $2 \times 10^{16}$ cm$^{-3}$ impurity concentration is formed from the major surface 20 inwardly such that an $N^-$-type portion 23 of the epitaxial silicon layer 3 remains between the bottom of the $P^-$-type impurity region 4 and the buried layer 2, and that an $N^-$-type portion 33 of the epitaxial silicon layer 3 remains between the side of the $P^-$-type impurity region 4 and the side of the $P^+$-type impurity region 5, and $N^+$-type impurity regions 6, 7 of $1 \times 10^{20}$ cm$^{-3}$ impurity concentration are formed from the major surface into the $P^-$-type impurity region 4.

The vertical multi-emitter transistor $Q_1$ (or $Q_2$) is constituted by the $N^+$-type impurity regions 6, 7 serving as first and second emitter regions, respectively, portions 24 of the $P^-$-type impurity region 4 under the emitter regions serving as base regions, and the portion 23 of the $N^-$-type epitaxial layer 3 serving as the collector region. The lateral load transistor $Q_3$ (or $Q_4$) is constituted by the $P^+$-type region 5 serving as the emitter region, the portion 33 of the $N^-$-type epitaxial layer 3 serving as the base region and a portion 34 of the $P^-$-type impurity region 3 near the $N^-$-type portion 33, serving as the collector region. Electrode wirings 10 to 14 are connected to respective regions or layers through contact holes formed in an insulating film 9 on the major surface 20 of the substrate for forming the memory cell circuit shown in FIG. 2. That is, the electrode 10 for the emitter region 5 of the transistor $Q_3$ (or $Q_4$) is electrically connected to the first word line $W_T$. The electrode 11 for the second emitter region 6 of the transistor $Q_1$ (or $Q_2$) is electrically connected to the first digit line $D_1$ (or to the second digit line $D_2$). The electrode 12 for the first emitter region 7 of the transistor $Q_1$ (or $Q_2$) is electrically connected to the second word line $W_B$. The electrode 13 for the base region 24 of the transistor $Q_1$ (or $Q_2$) and for the collector region 34 of the transistor $Q_3$ (or $Q_4$) is electrically connected to the electrode 14 of the other of the first and second series connections. The electrode 14 for the collector region 23 of the transistor $Q_1$ (or $Q_2$) and for the base region 33 of the transistor $Q_3$ (or $Q_4$) is electrically connected to the electrode 13 of the other of the first and second series connections.

In the prior art, the $N^-$-type base region 33 of the lateral PNP transistor $Q_3$ (or $Q_4$) is formed by the epitaxial layer 3, and has an uniform impurity concentration ($10^{16}$ cm$^{-3}$) from the major surface in full depth direction of the base region. Namely, the whole passage of the base region in which a large amount of current (collector current) flows in the writing operation is constituted only by a low impurity concentration portion. Therefore, the current amplification factor $\beta$ during the large current state cannot be sufficiently small, and a fast writing operation cannot be obtained.

Figure 5:
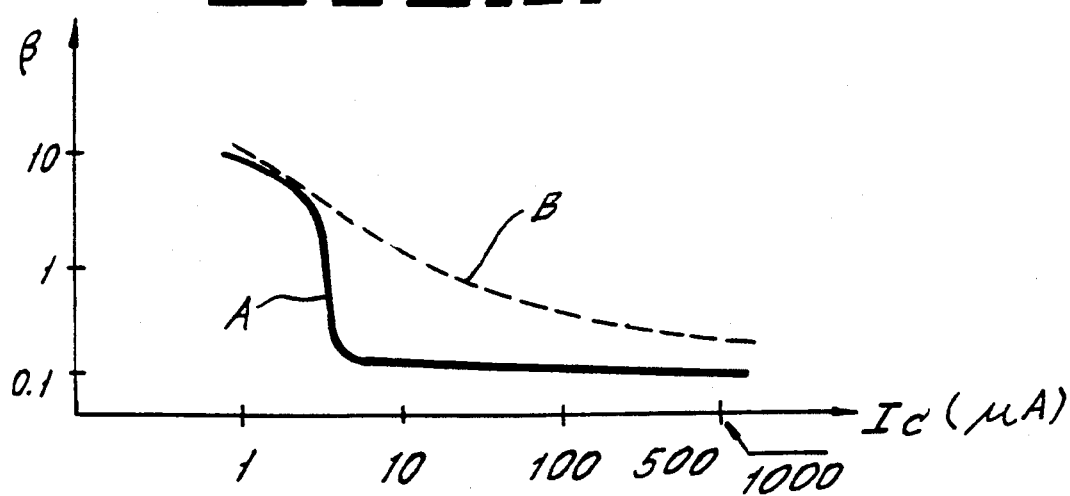
FIG. 5 is a diagram showing characteristics of current amplification factor $\beta$ at every collector current level, in which curve A shows $\beta$ in the present embodiment, and curve B shows $\beta$ in the prior art structure.

Referring to FIG. 5, a characteristic curve of the current amplification factor $\beta$ of the prior art structure is exemplified by dotted curve B. When the holding collector current ($I_c$) is 1 $\mu$A, the current amplification factor $\beta$ is larger than 7 (about 10), and therefore, a sufficient holding operation can be carried out. However, as shown in FIG. 5, the current amplification factor $\beta$ gradually decreases from a small amount of current range to a large amount of current range with a gentle slope. Therefore, when the writing operation is conducted under a collector current ($I_c$) of 500 $\mu$A, the current amplification factor $\beta$ is greater than 0.3, and therefore, the writing operation becomes inevitably and unfavorably slow.

Referring to FIGS. 4A and 4B, a first embodiment of the present invention will be explained. In FIGS. 4A and 4B, the same components as those in FIG. 3 are indicated by the same reference numerals.

The base region 63 of the lateral PNP transistor $Q_3$ (or $Q_4$) according to the present invention has a base width W of 1.0 $\mu$m and a base length L of 6.0 $\mu$m, and includes a first N-type portion 43 of low impurity concentration and a second N-type portion 53 of high impurity concentration. More specifically, the first portion 43 has the N-type impurity concentration of $1 \times 10^{16}$ cm$^{-3}$, and is formed from the major surface 20 to the depth $x_1$ of 0.3 $\mu$m so as to abut against both upper sides of the P$^+$-type emitter region 5 and the P$^-$-type collector region 34(4). The second portion 53 has the N-type impurity concentration of $5 \times 10^{18}$ cm$^{-3}$, which is less than the impurity concentration of the N$^+$-type buried layer 2, and is formed from the bottom of the first portion 43 to the N$^+$-type buried layer 2 by the depthwise, direction $x_2$ of 1.7 $\mu$m. The second portion 53 abuts the P$^+$-type emitter region 5 in full depth and the P$^-$-type collector region 34(4) at its upper part.

According to the present base structure, when the collector current ($I_c$) is at a small current range such as 1 $\mu$A during the holding operation, the N$^-$-type first portion 43 predominantly contributes to the operation, and therefore, the current amplification factor $\beta$ becomes large and a favorable holding operation can be carried out. On the other hand, when the collector current, ($I_c$) is at a large current range such as 500 $\mu$A during the writing operation, the N$^+$-type second portion 53 contributes to the operation with the first portion 43, because a passage of a large current extends deeper than that of a small current. Owing to the passage in the N$^+$-type second portion 53, the current amplification factor $\beta$ becomes sufficiently small during the writing operation, and therefore, a fast writing operation can be carried out.

Returning to FIG. 5, characteristic of the current amplification factor $\beta$ according to the present embodiment is shown by solid curve A. When the holding collector current ($I_c$) is 1 $\mu$A, the current amplification factor $\beta$ is higher than 7 (about 10), and therefore, a sufficient holding operation can be carried out. On the other hand, the current amplification factor $\beta$ is abruptly decreased at a current range of near 3 $\mu$A by a modulation of base conduction caused by the N$^+$-type second portion 53 of the base region (FIG. 4). Consequently, when the writing operation is conducted under a collector current ($I_c$) of 500 $\mu$A, the current amplification factor $\beta$ is less than 0.2 (about 0.1) which is sufficiently small to carry out a desirably fast writing operation. For example, in the prior art structure, the writing speed is slow such as 10 nano seconds. However, according to the present embodiment, the writing speed of the memory cell is very improved such as 5 nano seconds by adding the N$^+$-type second portion 53 (FIG. 4) to the prior art structure.

The N$^+$-type second portion 53 can be fabricated in a substrate before forming other regions, and therefore, the formation of the portion 53 never adversely affects other characteristics of the device.

Figure 6A:
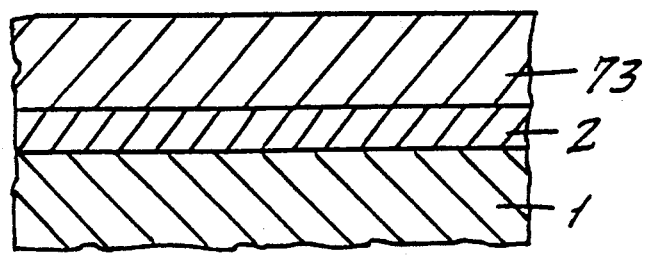
FIGS. 6A to 6C are cross-sectional views showing process steps in sequence for manufacturing the first embodiment.
Figure 6B:
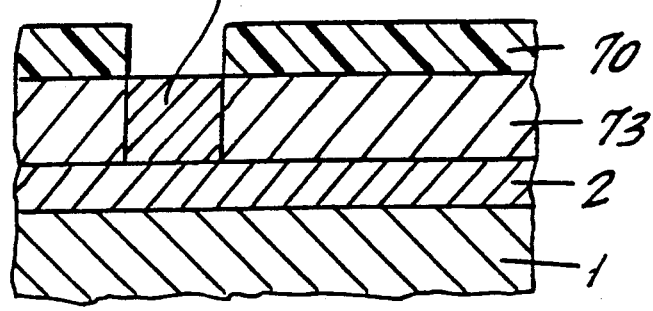
Figure 6C:
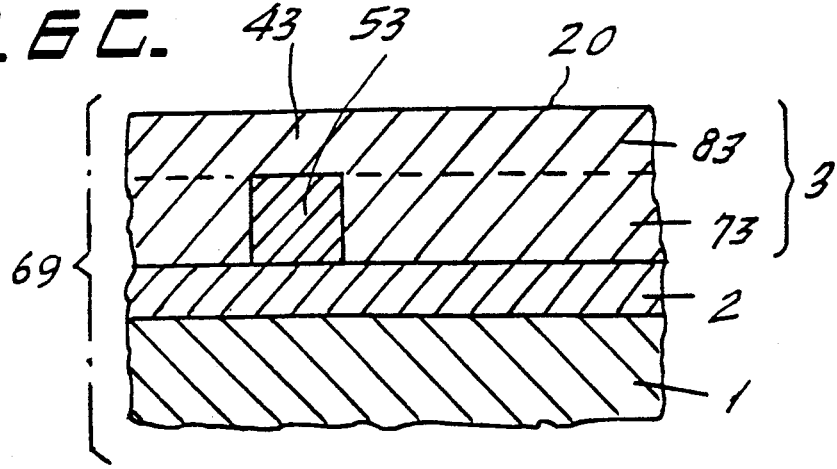

Referring to FIGS. 6A to 6C, the method of forming the substrate 69 of the first embodiment will be explained.

After forming the N$^+$-type buried layer 2 on the P$^-$-type silicon body 1, a silicon epitaxial layer is deposited such that the thickness of a first N$^-$-type silicon epitaxial layer 73 of $1 \times 10^{16}$ cm$^{-3}$ impurity concentration is 1.7 $\mu$m (FIG. 6A). Next, the N$^+$-type impurity region 53 is selectively formed in the first N$^-$-type layer 73 through an arsenic ion implantation method using a photo-resist pattern 70 as a mask (FIG. 6B). After removing photo-resist mask 70, a second N$^-$-type silicon epitaxial layer 83 of $1 \times 10^{16}$ cm$^{-3}$ impurity concentration is deposited by 0.3 $\mu$m thickness to form the silicon substrate 69 including the N$^+$-type second portion 53 of the base region (FIG. 6C). The first and second silicon epitaxial layers 73, 83 constitute the N$^-$-type silicon layer 3, and a part 43 of the second silicon epitaxial layer 83 on the N$^+$-type portion 53 remains after forming the P$^+$-type emitter region 5, the P$^-$-type collector region 34(4), etc. to form the N$^-$-type first portion 43 of the base region.

Figure 7:
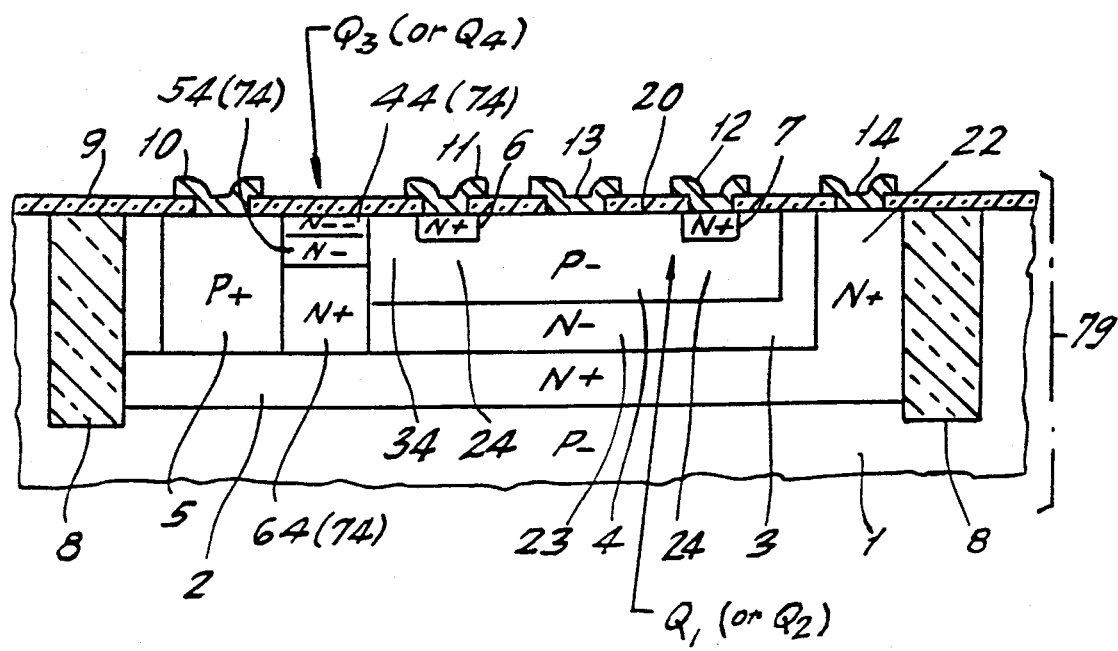
FIG. 7 is a cross-sectional view showing a second embodiment of the present invention.

FIG. 7 shows a second embodiment of the present invention. In FIG. 7, the same components as those in FIGS. 3 and 4 are indicated by the same reference numerals.

In the second embodiment, the base region 74 includes an N$^{--}$-type upper portion 44 of $1 \times 10^{15}$ cm$^{-3}$ impurity concentration, an N$^-$-type middle portion 54 of $1 \times 10^{16}$ cm$^{-3}$ and a N$^{30}$-type lower portion 64 of $5 \times 10^{18}$ cm$^{-3}$ impurity concentration. The second embodiment can be regarded that the first portion 43 in the first embodiment is divided to the upper and middle portions 44 and 54, that is, only the major surface part of the N$^-$-type first portion 43 is modified to further lower impurity concentration (N$^{--}$-type). The current amplification factor $\beta$ of the second embodiment at the writing operation can be at a sufficiently low level of 0.2 or less, and therefore, a desirable fast writing operation can be assured, because the N$^+$-type portion 64 of high impurity concentration is also provided in the base region. On the other hand, owing to the N$^{--}$-type surface portion 44, the current amplification factor $\beta$ in a small collector current range at the holding time becomes a higher level than the first embodiment, and therefore, a further strong immunity against $\alpha$ radiations or noises can be obtained.

Referring to FIGS. 8A to 8E, the method of forming the substrate 79 of the second embodiment will be explained.

Figure 8A:
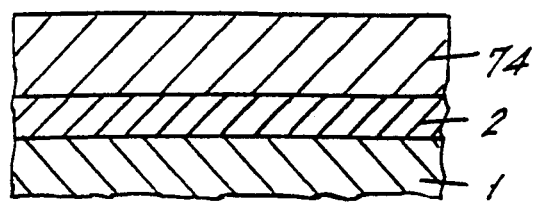
FIGS. 8A to 8E are cross-sectional views showing process steps in sequence for manufacturing the second embodiment.
Figure 8B:
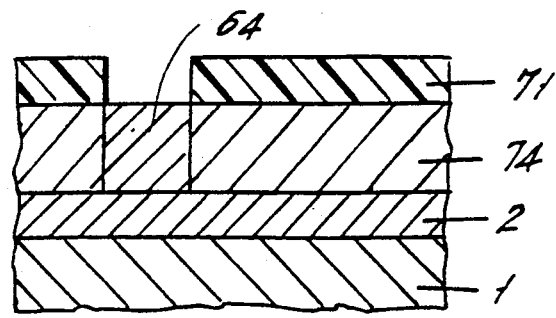
Figure 8C:
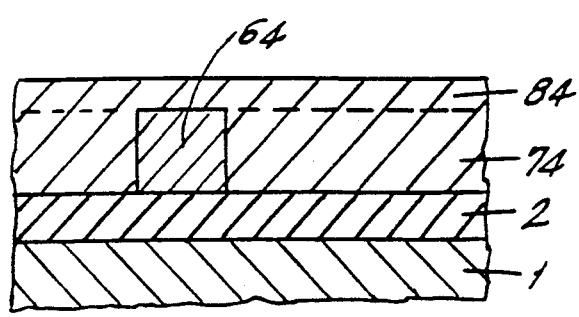
Figure 8D:
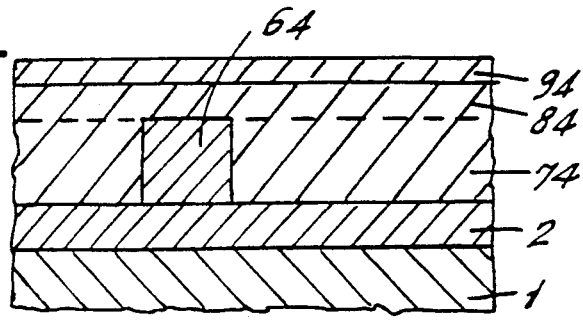
Figure 8E:
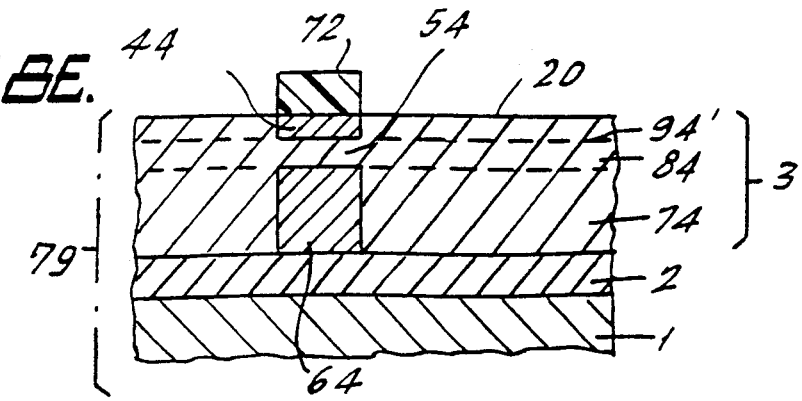

The process steps shown in FIGS. 8A to 8C are the same as in FIGS. 6A to 6C. That is, at first, the N+-type buried layer 2 and an N−-type first epitaxial layer 74 of $1 \times 10^{16}$ cm$^{-3}$ impurity concentration is formed on the P−-type silicon body (FIG. 8A). Then, the N+-type lower portion 64 of the base region is formed in the first epitaxial layer 74 through an arsenic ion implantation method by using a photo-resist pattern 71 as a mask (FIG. 8B). Next, after removing the photo-resist mask pattern 71, an N−-type second silicon epitaxial layer 84 of $1 \times 10^{16}$ cm$^{-3}$ impurity concentration is formed (FIG. 8C). Then, an N−−-type third epitaxial layer 94 of $1 \times 10^{15}$ cm$^{-3}$ impurity concentration is formed (FIG. 8D). Next, arsenic impurities are introduced in the N−−-type third epitaxial layer 94 except a part 44 under a photo-resist mask 72 so that the part 44 remains the N−−-type of $10^{15}$ cm$^{-3}$ impurity concentration and other parts are changed to an N−-type silicon layer 94' of $1 \times 10^{16}$ cm$^{-3}$ impurity concentration (FIG. 8E). The silicon layers 94', 84 and 74 constitute the silicon epitaxial layer 3. The remaining N−−-type part 44 of the third silicon epitaxial layer 94 becomes the upper portion 44 of the base region and an N−-type part 54 of the second silicon epitaxial layer 84 under the part 44 becomes the middle portion 54 of the base region after removing the photo-resist mask 72 and after forming the P+-type emitter region 5, the P−-type collector region 34(4), etc. in the silicon substrate 79, or in the silicon epitaxial layer 3.

I claim:

1. A semiconductor memory device comprising; a semiconductor substrate having a major surface and a plurality of memory cells formed on said substrate, each of said memory cells including a lateral bipolar transistor as a load element, each of said transistors having a collector region of a first conductivity type formed in said substrate and extending from said major surface, an emitter region of said first conductivity type formed in said substrate and extending from said major surface and a base region of a second conductivity type, opposite to said first conductivity type, formed in said substrate and extending from said major surface and being located between said collector and emitter regions, said base region having an impurity concentration of said second conductivity type which is increased from said major surface in the depth direction of said base region, each of said transistors having a current amplification factor characteristic which abruptly decreases as the collector current through said transistor increases when said memory cell of which forms a part is switched between a memory holding operation and a memory writing operation.

2. A semiconductor memory device of claim 1, in which said first conductivity type is P-type; said second conductivity type is N-type; and said transistor is a PNP type lateral bipolar transistor.

3. A semiconductor memory device of claim 1, in which said base region includes a first portion having an upper surface coinciding with said major surface, sides abutted against said collector and emitter regions with PN junctions, respectively, and a bottom, and a second portion having an upper face adjacent to said bottom of said first portion and sides abutted against said collector and emitter regions with PN junctions, respectively, said second portion of said base region having a higher impurity concentration of said second conductivity type than said first portion of said base region.

4. A semiconductor memory device of claim 3, in which said impurity concentration of said first portion is $1 \times 10^{14}$ cm$^{-3}$ or more and $1 \times 10^{17}$ cm$^{-3}$ or less, and said impurity concentration of said second portion is $1 \times 10^{18}$ cm$^{-3}$ or more.

5. A semiconductor memory device of claim 3, in which said bottom of said first portion is positioned at a depth from said major surface ranging from 0.1 μm to 0.6 μm.

6. A semiconductor memory device of claim 1, in which said base region includes a upper portion having a first impurity concentration of said second conductivity type, coinciding at its upper face with said major surface of said substrate and adjacent at its sides to said collector and emitter regions with PN junctions, respectively, a middle portion having a second impurity concentration of said second conductivity type higher than said first impurity concentration, positioned underneath said upper portion and adjacent at its sides to said collector and emitter regions with PN junctions, respectively, and a lower portion having a third impurity concentration of said second conductivity type higher than said second impurity concentration, positioned underneath said middle portion and adjacent at its sides with PN junctions, respectively.

7. A semiconductor memory device of claim 6, in which said first and second impurity concentrations are $1 \times 10^{14}$ cm$^{-3}$ or more and $1 \times 10^{17}$ cm$^{-3}$ or less, and said third impurity concentration is $1 \times 10^{18}$ cm$^{-3}$ or more.

8. A semiconductor memory device of claim 6, in which the boundary of said middle and lower portions is positioned at a depth from said major surface ranging from 0.1 μm to 0.6 μm.

9. A semiconductor memory device, comprising:

a semiconductor substrate having a major surface, a plurality of pairs of first and second word lines formed on said substrate, a plurality of pair of first and second digit lines formed on said substrate and a plurality of memory cells formed on said substrate, arranged in matrix form and coupled to respective said pairs of word lines and to respective said pairs of digit lines;

each of said memory cells including a first series connection of a first load transistor and a first multiemitter transistor, and a second series connection of a second load transistor and a second multiemitter transistor, said first and second series connections being cross coupled with each other;

said substrate including a buried layer of a first conductivity type, an epitaxial layer of said first conductivity type having a lower impurity concentration than said buried layer, said epitaxial layer having a bottom abutting against said buried layer, an upper face and a side wall, and an impurity region of a second conductivity type opposite to said first conductivity type having an upper face coinciding with said major surface of said substrate, a bottom abutting against said upper face of said epitaxial layer and upper and lower side walls;

each of said first and second multiemitter transistors being a vertical bipolar transistor and having first collector, base and multiemitter regions, said first multiemitter regions being of said first conductivity type and extending from said major surface inwardly into said impurity region, said first base region being of said second conductivity type and being constituted of parts of said impurity region under said first multiemitter regions, and said first collector regions being formed of said first conductivity type and being constituted of parts of said epitaxial layer and formed beneath said first base regions;

each of said first and second load transistors being a lateral bipolar transistor and having second collector, base and emitter regions, said second emitter region being of said second conductivity type and being formed in said substrate extending from said major surface inwardly and having a bottom abutting against said buried layer and having upper and lower side walls, said second collector region being of said second conductivity type and being constituted of a part of said impurity region, said part of said impurity region constituting said second collector region having said upper and lower side walls of said impurity region, and said second base region being of said first conductivity type and being formed in said substrate at a location between said second collector region and said second emitter region, and having a first portion coinciding with said major surface an formed inwardly abutting against said upper side wall of said second collector region and against said upper side wall of said second emitter region with P-N junctions, respectively, and a bottom, and a second portion formed in said substrate adjacent to said bottom of said first portion and abutting against both said lower side wall of said second collector region and said side wall of said epitaxial layer constituting said first collector region, and against said lower side wall of said second emitter region with P-N junctions, respectively, said second portion having a bottom abutted against said buried layer, said second portion of said second base region having a higher impurity concentration than said first portion of said second base region and than said epitaxial layer which constitutes said first collector region of said multiemitter transistor;

a first electrode of said second emitter region of said load transistor being formed on said major surface of said substrate and being connected to said second emitter region, a second electrode of said first base region of said multiemitter transistor and of said second collector region of said load transistor being formed on said major surface of said substrate and being connected to said impurity region, and a third electrode of said first collector region of said multiemitter transistor and of said second base region of said load transistor being formed o a part of said major surface of said substrate so that a base voltage is supplied to said second base region through said buried layer and through said bottom of said second portion, of said second base region, whereby said load transistors have a current amplification factor characteristic which is abruptly decreased when the collector current through said load transistor increases when said memory cell of which it forms a part is switched between a memory holding operation and a memory writing operation.

10. A semiconductor memory device of claim 9, in which said emitter and collector regions of said first and second load transistors are P-type; said base regions of said first and second load transistors are N-type; and said first and second multi-emitter transistors are vertical bipolar transistors each having an N-type collector region, a P-type base region and first and second N-type emitter regions.

11. A semiconductor memory device of claim 10, in which said P-type collector region of said first load transistor and said P-type base region of said first multi-emitter transistor are positioned in a same P-type section of said substrate; and said P-type collector region of said second load transistor and said P-type base region of said second multi-emitter transistor are positioned in a same P-type section of said substrate.

12. A semiconductor memory device of claim 9, in which said first conductivity type is N-type; said second conductivity type is P-type; and said transistor is a PNP-type lateral bipolar transistor.

13. A semiconductor memory device of claim 9, in which said impurity concentration of said first portion is $1 \times 10^{14}$ cm$^{-3}$ or more and said impurity concentration region of said second portion is $1 \times 10^{18}$ cm$^{-3}$ or more.

14. A semiconductor memory device of claim 13, in which said bottom of said first portion is positioned at a depth from said major surface ranging from 0.1 μm to 0.6 μm.

15. A semiconductor memory device of claim 9 in which said first portion of said second base region of said load transistor includes an upper section coinciding with said major surface of said substrate abutted against said upper side walls of said second emitter and collector regions respectively, and a lower section positioned under said upper section and abutted against said upper side walls of said second emitter and collector regions, respectively, said upper section having an impurity concentration lower than that of said lower section.

* * * * *